(12) United States Patent
Kaneko et al.

(10) Patent No.: US 11,410,941 B2
(45) Date of Patent: Aug. 9, 2022

(54) SEMICONDUCTOR MODULE

(71) Applicant: FUJI ELECTRIC CO., LTD., Kawasaki (JP)

(72) Inventors: Satoshi Kaneko, Kawasaki (JP); Hisato Inokuchi, Kawasaki (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 17/216,780

(22) Filed: Mar. 30, 2021

(65) Prior Publication Data

US 2021/0375786 A1    Dec. 2, 2021

(30) Foreign Application Priority Data

May 29, 2020   (JP) .............................. JP2020-094379

(51) Int. Cl.
     *H01L 23/495*      (2006.01)
     *H01L 23/00*      (2006.01)
     *H01L 25/065*      (2006.01)

(52) U.S. Cl.
     CPC ...... *H01L 23/562* (2013.01); *H01L 23/49517* (2013.01); *H01L 24/49* (2013.01); *H01L 25/0655* (2013.01); *H01L 2224/49113* (2013.01)

(58) Field of Classification Search
CPC ............. H01L 23/562; H01L 23/49517; H01L 24/49; H01L 25/0655; H01L 2224/49113; H01L 23/04; H01L 23/053; H01L 23/24; H01L 23/36; H01L 23/5385; H01L 24/37; H01L 24/40; H01L 24/45; H01L 24/48; H01L 2224/37124; H01L 2224/37147; H01L 2224/3716; H01L 2224/40225; H01L 2224/45014; H01L 2224/45124; H01L 2224/45144; H01L 2224/45147; H01L 2224/48091; H01L 2224/48139; H01L 2224/48227; H01L 2224/49111; H01L 2924/1203; H01L 23/49811; H01L 23/3735; H01L 2924/13055; H01L 25/072; H01L 23/48

See application file for complete search history.

(56) References Cited

U.S. PATENT DOCUMENTS

| | | |
|---|---|---|
| 2004/0070066 A1 | 4/2004 | Ogawa |
| 2015/0077943 A1 | 3/2015 | Miyake et al. |
| 2020/0052420 A1 | 2/2020 | Mitsumoto |

FOREIGN PATENT DOCUMENTS

| | | | |
|---|---|---|---|
| JP | 2004-134569 A | 4/2004 |
| JP | 2015-056614 A | 3/2015 |
| JP | 2020-024838 A | 2/2020 |

*Primary Examiner* — Elias Ullah
(74) *Attorney, Agent, or Firm* — Rabin & Berdo, P.C.

(57) ABSTRACT

A semiconductor module includes semiconductor elements, a case that houses the semiconductor elements, an external terminal electrically connecting the semiconductor elements and an external conductor, and a nut into which a bolt that secures the external conductor and the external terminal is threaded. The nut includes a cylindrical main body having a threaded hole, and a flange projecting in a direction radially outward of a center axis of the threaded nut hole and being disposed on one face of the main body. The case includes a wall surrounding the nut, the wall having a first recess that houses the main body, a second recess above the first recess and housing the flange, and a notch cut in a portion of the wall surrounding the main body. The first recess extends deeper than the main body, and the fillet is formed on a floor surface of the first recess.

11 Claims, 5 Drawing Sheets

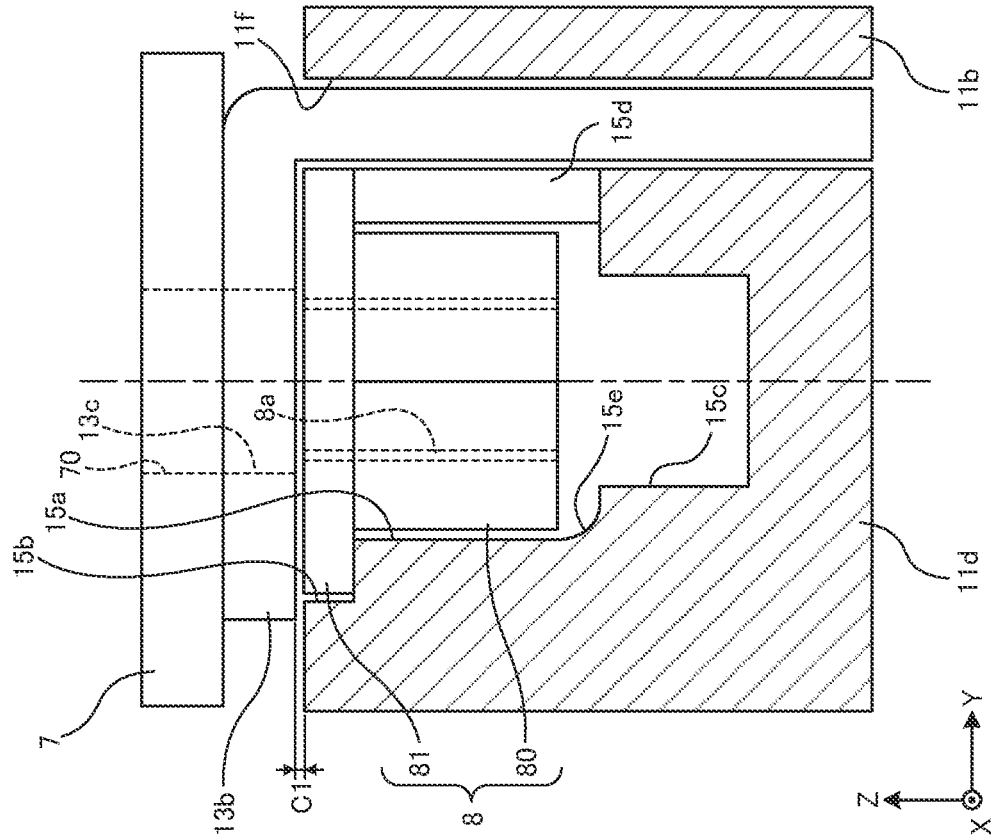

SEMICONDUCTOR MODULE

CROSS REFERENCE TO RELATED APPLICATIONS

This application is based upon and claims the benefit of priority of the prior Japanese Patent Application No. 2020-094379, filed on May 29, 2020, the entire contents of which are incorporated herein by reference.

BACKGROUND OF THE INVENTION

Field of the Invention

The present invention relates to a semiconductor module.

Description of the Related Art

Semiconductor devices have a substrate on which semiconductor elements such as an insulated-gate bipolar transistor (IGBT), a power metal-oxide-semiconductor field-effect transistor (power MOSFET), and a free-wheeling diode (FWD) are provided, and are used in apparatuses such as inverters (see Japanese Patent Laid-Open Nos. 2020-024838, 2015-056614, and 2004-134569, for example).

In semiconductor modules of this type, semiconductor elements disposed on a predetermined substrate are housed in a plastic case member for example. On the top face of the case member, external terminals for connecting to external conductors are provided. Nuts for fastening external conductors to the external terminals are disposed under the external terminals. Each nut is housed inside a recess formed on the top face of the case member.

SUMMARY OF THE INVENTION

In Patent Literature 1, a portion of the surrounding wall of the case member that forms the recess housing each nut is partially cut away to form a notch. Consequently, when a bolt is tightened on a nut, there are concerns that cracks may develop in the floor of the notch and the case member may be damaged.

An object of the present invention, which has been devised in light of this point, is to provide a semiconductor module capable of preventing damage to the case member.

A semiconductor module according to an aspect of the present invention is provided with a semiconductor element, a case that houses the semiconductor element, an external terminal that electrically connects the semiconductor element and an external conductor, and a nut into which the tip of a bolt that secures the external conductor and the external terminal is threaded. The nut includes a cylindrical main body having a threaded hole formed in the center, and a flange projecting radially outward on one face of the main body. The case includes a first recess that houses the main body, a second recess that is formed above the first recess and houses the flange, and a notch in which a portion of a surrounding wall that forms the first recess and the second recess is cut away. The first recess is formed deeper than the thickness of the main body, and a fillet is formed on a floor surface of the first recess.

According to the present invention, damage to the case can be prevented.

BRIEF DESCRIPTION OF THE DRAWINGS

FIGS. 5A and 5B are partial cross sections of the area around the nut housing illustrated in FIG. 3.

DETAILED DESCRIPTION OF THE PREFERRED EMBODIMENT

Figure 1:
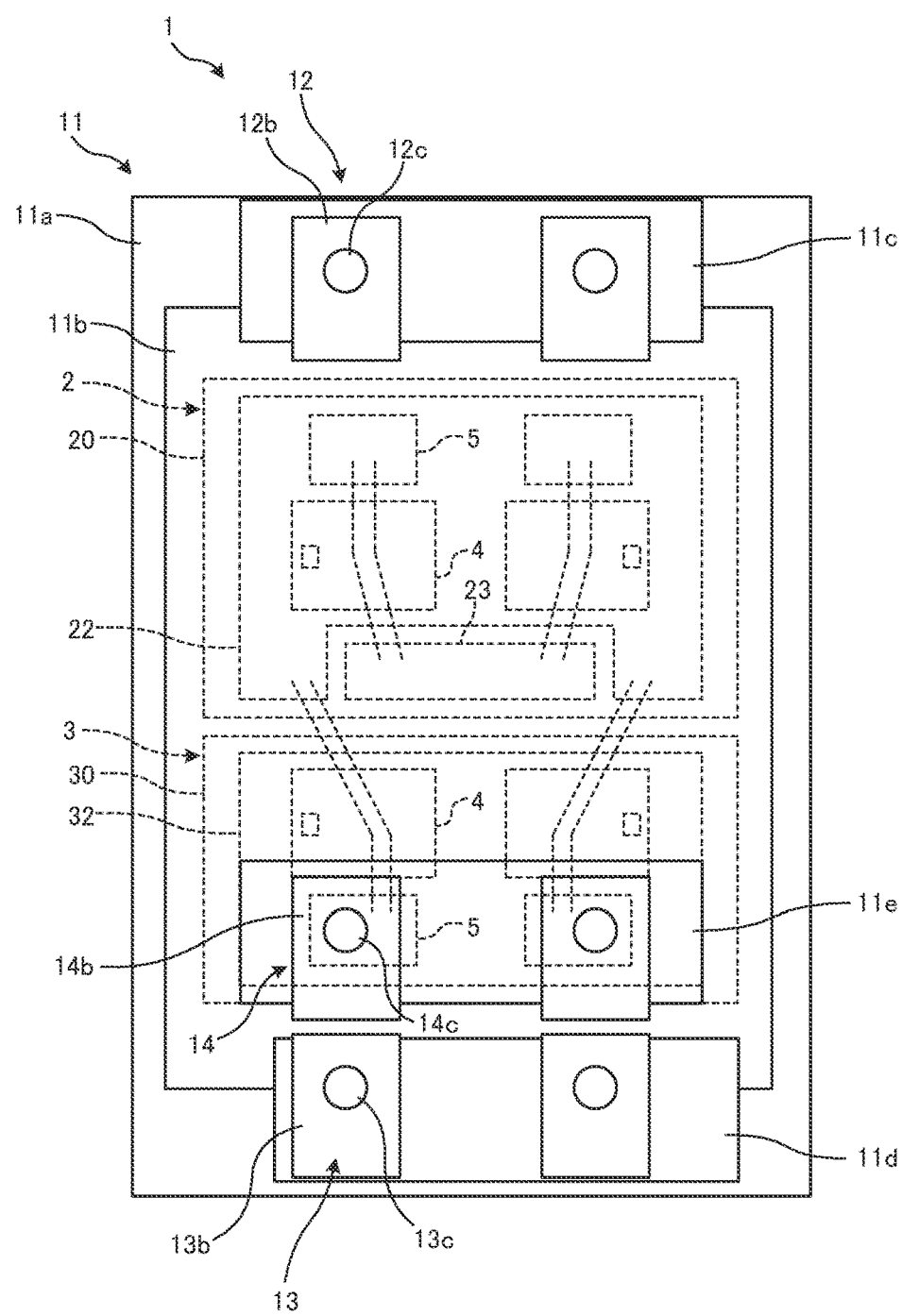
FIG. 1 is a plan view of a semiconductor module according to an embodiment.
Figure 2:
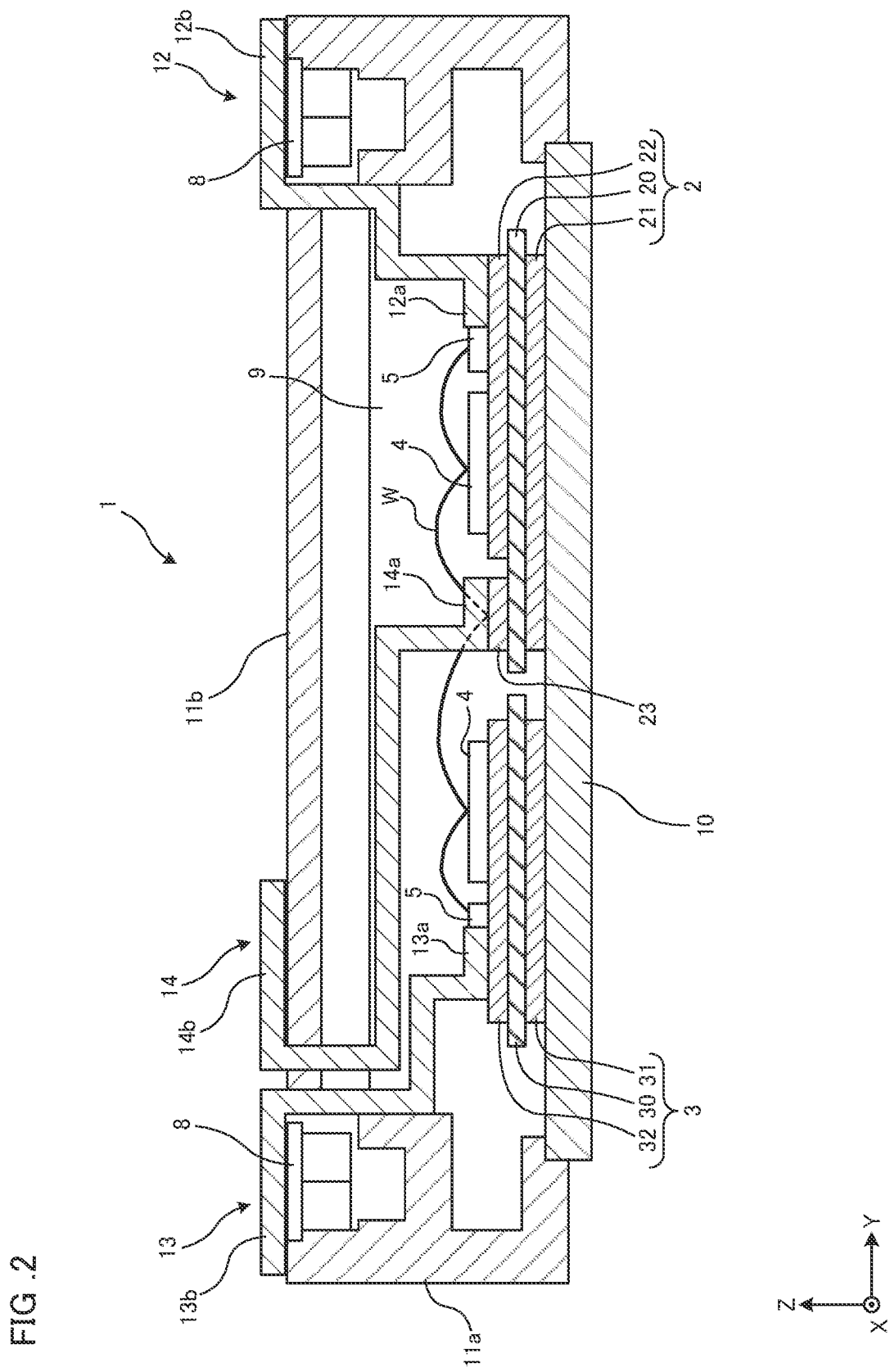
FIG. 2 is a cross section taken in the YZ plane of the semiconductor module illustrated in FIG. 1.

Hereinafter, a semiconductor module capable of applying the present invention will be described. FIG. 1 is a plan view of a semiconductor module according to the embodiment. FIG. 2 is a cross section taken in the YZ plane of the semiconductor module illustrated in FIG. 1. Note that the semiconductor module illustrated below is merely one non-limiting example, and may be modified appropriately.

Also, in the following diagrams, the short direction of the semiconductor module (the direction in which the switching elements described later are arranged) is defined to be the X direction, the long direction of the semiconductor module is defined to be the Y direction, and the height direction (the thickness direction of the substrate) is defined to be the Z direction. The illustrated X, Y, and Z axes are orthogonal to each other and constitute a right-handed coordinate system. Additionally, in some cases, the X direction may be referred to as the transverse direction, the Y direction as the longitudinal direction, and the Z direction as the vertical direction. These directions (transverse, longitudinal, and vertical directions) are terms used for convenience in the description, and depending on the installed attitude of the semiconductor module, the correspondence relationships between these directions and the XYZ directions may change. For example, the surface on the heat-dissipating side (cooler side) of the semiconductor module is referred to as the bottom face, while the opposite side is referred to as the top face. Also, in this specification, a plan view means the case of viewing the top face of the semiconductor module from the positive Z direction. Also, in this specification, directional and angular notations may be rough directions and angle, and values within ±10 degrees may be tolerated.

The semiconductor module according to this embodiment is applied to a power conversion device such as a power module, for example, and is a power module that forms an inverter circuit. FIG. 1 will be referenced to describe a single semiconductor module 1. FIG. 1 illustrates a configuration of an inverter circuit for a single phase containing upper and lower arms. For example, in the case where the semiconductor module forms a three-phase inverter, three semiconductor modules like that of FIG. 1 are arranged in the X direction for example in the order of U phase, V phase, W phase.

As illustrated in FIGS. 1 and 2, the semiconductor module 1 includes a base plate 10, multilayer substrates 2 and 3 disposed on top of the base plate 10, a plurality of semiconductor elements disposed on top of the multilayer substrates 2 and 3, a case member 11 that houses the multilayer substrates 2 and 3 and the plurality of semiconductor elements, and an encapsulating resin 9 that fills an inner space of the case member 11.

The base plate 10 is a rectangular plate having a top face and a bottom face. The base plate 10 functions as a heatsink. Additionally, the base plate 10 has a rectangular shape in a plan view having a short side in the X direction and a long side in the Y direction. The base plate 10 is a metal plate containing copper, aluminum, or an alloy thereof, for example. The surface of the base plate 10 may also be plated.

The case member 11 having a rectangular shape in a plan view is disposed on the top face of the base plate 10. The case member 11 includes a frame-shaped case frame 11a and a case lid 11b that covers the top opening of the case frame 11a. The case member 11 is formed with plastic for example, and is bonded to the top face of the base plate 10 by an adhesive (not illustrated). The case frame 11a is formed into a rectangular cylindrical shape so as to surround the outer periphery of the base plate 10. The top face of the case frame 11a is open in the center. Although details will be described later, after a predetermined configuration is disposed in the space inside the case frame 11a, the remaining space is filled with the encapsulating resin 9. The encapsulating resin 9 encapsulates the multilayer substrates 2 and 3, a plurality of semiconductor elements 4 and 5, a wiring member W, and part of a plurality of external terminals 12 to 14. The encapsulating resin 9 does not fill a nut housing that houses each nut 8. Additionally, the top opening of the case frame 11a is closed by the case lid 11b. In other words, the case member 11 demarcates a space that houses the multilayer substrates 2 and 3, the semiconductor elements, the encapsulating resin 9, and one of the external terminals.

In addition, the case member 11 is provided with a plurality of external terminals. Specifically, the external terminals include a positive electrode terminal 12 (P terminal), a negative electrode terminal 13 (N terminal), and an output terminal 14 (M terminal). Furthermore, the external terminals may be control terminals (not illustrated). Each external terminal is embedded and integrated into the case member 11.

Specifically, in the case frame 11a, terminal placement parts 11c and 11d where external terminals are embedded are disposed in a pair of side walls that face opposite each other in the Y direction. The terminal placement parts 11c and 11d form part of the case frame 11a, and have a cuboid shape that is long in the X direction. In the case frame 11a, the terminal placement part 11c is positioned on the positive Y side while the terminal placement part 11d is positioned on the negative Y side. Also, in the case lid 11b, a terminal placement part 11e where an external terminal is embedded is disposed on the end on the negative Y side. The terminal placement part 11e forms part of the case lid 11b, and has a cuboid shape that is long in the X direction.

Each external terminal is formed by a process such as press working a metal plate such as a copper material, a copper alloy material, an aluminum alloy material, or an iron alloy material, and is embedded in the corresponding terminal placement part. Specifically, the positive electrode terminal 12 has one end designated a first end 12a and another end designated a second end 12b. The first end 12a is disposed inside the case member 11 and is embedded in the encapsulating resin 9. The second end 12b is disposed outside the case member 11. The first end 12a is connected to a predetermined circuit board (the circuit board 22 described later) inside the case member 11. The main surface of the intermediate part between the first end 12a and the second end 12b is disposed along the inner wall face of the terminal placement part 11c of the case member 11. The second end 12b projects out from the top face of the case member 11, with the leading end bent at a substantial right angle along the top face of the case member 11 (terminal placement part 11c). In other words, the main surface of the positive electrode terminal 12 is disposed along the inner wall face and the top face of the terminal placement part 11c. Two second ends 12b are arranged in the X direction. In the center of each second end 12b, a through-hole 12c penetrating in the thickness direction is formed.

Similarly, the negative electrode terminal 13 has one end designated a first end 13a and another end designated a second end 13b. The first end 13a is disposed inside the case member 11 and is embedded in the encapsulating resin 9. The second end 13b is disposed outside the case member 11. The first end 13a is connected to a predetermined circuit board (the circuit board 32 described later) inside the case member 11. The main surface of the intermediate part between the first end 13a and the second end 13b is disposed along the inner wall face of the terminal placement part 11d of the case member 11. The second end 13b projects out from the top face of the case member 11, with the leading end bent at a substantial right angle along the top face of the case member 11 (terminal placement part 11d). In other words, the main surface of the negative electrode terminal 13 is disposed along the inner wall face and the top face of the terminal placement part 11d. Two second ends 13b are arranged in the X direction. In the center of each second end 13b, a through-hole 13c penetrating in the thickness direction is formed.

Also, the output terminal 14 has one end designated a first end 14a and another end designated a second end 14b. The first end 14a is disposed inside the case member 11 and is embedded in the encapsulating resin 9. The second end 14b is disposed outside the case member 11. The first end 14a is connected to a predetermined circuit board (the circuit board 23 described later) inside the case member 11. The main surface of the intermediate part between the first end 14a and the second end 14b is disposed along the inner wall face of the terminal placement part 11e of the case member 11. The second end 14b projects out from the top face of the case member 11, with the leading end bent at a substantial right angle along the top face of the case member 11 (terminal placement part 11d). In other words, the main surface of the output terminal 14 is disposed along the inner wall face and the top face of the terminal placement part 11e. Two second ends 14b are arranged in the X direction. In the center of each second end 14b, a through-hole 14c penetrating in the thickness direction is formed.

Although described in detail later, an external conductor 7 such as a busbar is fastened to each of these external terminals using a bolt 6 (see FIGS. 4A, 4B, 5A, and 5B). In addition, the nut 8 into which the tip of the bolt 6 is threaded is disposed below the second end of each external terminal (see FIGS. 4A, 4B, 5A, and 5B). The nut 8 is housed in a nut housing 15 (see FIG. 3) formed in each terminal placement part.

Also, on the inner side of the case frame 11a, the multilayer substrates 2 and 3 are disposed on the top face of the base plate 10. The multilayer substrates 2 and 3 are formed by stacking metal layers and insulating layers, and includes a direct copper bonding (DCB) substrate, an active metal brazing (AMB) substrate, or a metal base substrate, for example. Specifically, the multilayer substrate 2 includes an insulating plate 20, a heatsink 21 disposed on the bottom face of the insulating plate 20, and circuit boards 22 and 23 disposed on the top face of the insulating plate 20. Similarly, the multilayer substrate 3 includes an insulating plate 30, a heatsink 31 disposed on the bottom face of the insulating plate 30, and a circuit board 32 disposed on the top face of the insulating plate 30. The multilayer substrates 2 and 3 are each formed into a rectangular shape in a plan view for example, and are arranged in the Y direction. In FIG. 1, the multilayer substrate 2 is positioned on the positive Y side and the multilayer substrate 3 is positioned on the negative Y side. Note that the multilayer substrate 2 side forms an upper arm and the multilayer substrate 3 side forms a lower arm.

Each of the insulating plates 20 and 30 has a predetermined thickness in the Z direction, and is formed into a tabular shape having a top face and a bottom face. Each of the insulating plates 20 and 30 is formed by a ceramic material such as alumina ($Al_2O_3$), aluminum nitride (AlN), or silicon nitride ($Si_3N_4$), a resin material such as epoxy, or an insulating material such as an epoxy resin using a ceramic material as a filler, for example. Note that the insulating plates 20 and 30 may also be referred to as insulating layers or insulating films.

Each of the heatsinks 21 and 31 has a predetermined thickness in the Z direction, and is formed so as to cover substantially the entire bottom face of the insulating plates 20 and 30. Each of the heatsinks 21 and 31 is formed using a metal plate with favorable thermal conductivity, such as copper or aluminum, for example.

On the top face (main surface) of the insulating plate 20, two circuit boards 22 and 23 are formed as independent islands that are electrically insulated from each other. Similarly, on the top face (main surface) of the insulating plate 30, a single independent circuit board 32 is formed. These circuit boards contain a metal layer of predetermined thickness formed by copper foil or the like.

On the top faces of these circuit boards 22, 23, and 32, external terminals such as the positive electrode terminal 12 (P terminal), the negative electrode terminal 13 (N terminal), and the output terminal 14 (M terminal) as well as a plurality of semiconductor elements are disposed. The first ends 12a, 13a, and 14a of the external terminals 12, 13, and 14 are connected to the top face of the circuit boards 22, 23, and 32, either directly by ultrasonic welding, laser welding, or the like, or through a bonding material such as solder or sintered metal. With this configuration, the first ends 12a, 13a, and 14a of the external terminals 12, 13, and 14 are conductively connected to the circuit boards 22, 23, and 32.

The plurality of semiconductor elements are disposed on the top face of the circuit boards 22 and 32 through a bonding material such as solder. With this configuration, bottom electrodes of each of the semiconductor elements are conductively connected to the circuit boards 22 and 32. Accordingly, the external terminals and the semiconductor elements are conductively connected.

The semiconductor elements are formed having a square shape in a plan view by a semiconductor substrate such as silicon (Si), silicon carbide (SiC), or gallium nitride (GaN), for example. Note that a switching element such as an insulated-gate bipolar transistor (IGBT) or a power metal-oxide-semiconductor field-effect transistor (power MOSFET), or a diode such as a free-wheeling diode (FWD), is used as each of the semiconductor elements. Hereinafter, in the embodiment, some of the switching elements are designated IGBT elements 4 while other switching elements are designated diode elements 5. Also, an element such as a reverse-conducting IGBT (RC-IGBT) element that combines an IGBT and an FWD in one, a power MOSFET element, or a reverse-blocking IGBT (RB-IGBT) having a sufficient withstand voltage with respect to a reverse bias may also be used as each of the semiconductor elements. Also, properties such as the shape, number, and placement of the semiconductor elements may be changed appropriately. Note that the semiconductor elements according to this embodiment are vertical switching elements in which a functional element such as a transistor is formed on a semiconductor substrate.

In this embodiment, four semiconductor elements are disposed on each top face of the circuit boards 22 and 32. Specifically, two IGBT elements 4 and two diode elements 5 are disposed on each of the circuit boards 22 and 32. The two IGBT elements 4 are arranged in the X direction, and the two diode elements 5 are also arranged in the X direction. Also, the IGBT element 4 and the diode element 5 positioned on the negative X side form a pair arranged in the Y direction. Similarly, the other IGBT element 4 and the other diode element 5 positioned on the positive X side also form a pair arranged in the Y direction. In the circuit board 22, the IGBT elements 4 are positioned on the negative Y side and the diode elements 5 are positioned on the positive Y side. In the circuit board 32, the IGBT elements 4 are positioned on the positive Y side and the diode elements 5 are positioned on the negative Y side. Also, each IGBT element 4 is disposed such that a gate electrode on the top face is positioned on the side near the perimeter of the module.

Also, the IGBT element 4 and the diode element 5 arranged in the Y direction are electrically connected by the wiring member W. The IGBT elements 4 on the circuit board 22 are electrically connected to the circuit board 23 by the wiring member W. The IGBT elements 4 on the circuit board 32 are electrically connected to the circuit board 22 by the wiring member W.

Conductor wires (bonding wires) are used as these wiring members. Gold, copper, aluminum, gold alloy, copper alloy, and aluminum alloy can be used either singly or in combination with each other as the material of the conductor wires. Additionally, it is also possible to use members other than conductor wires as the wiring members. For example, ribbons can be used as the wiring members. Furthermore, the wiring members are not limited to wires or the like, and may also be formed by a metal plate such as a copper material, a copper alloy material, an aluminum alloy material, or an iron alloy material, for example.

Figure 3:
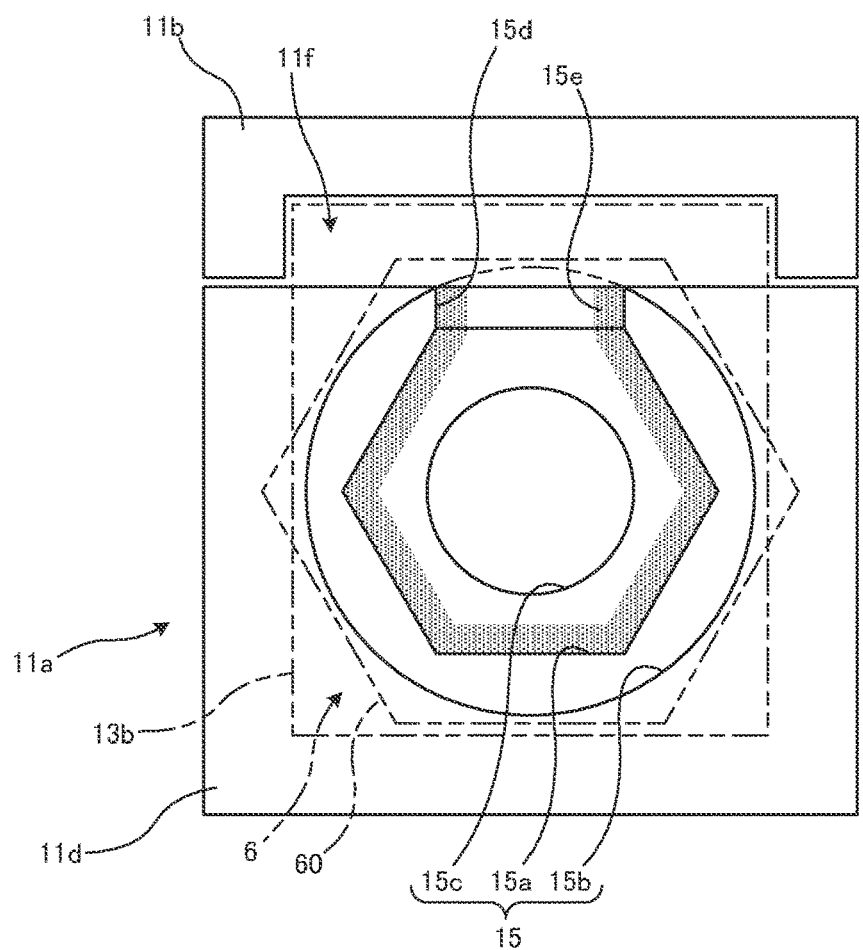
FIG. 3 is a plan view of the area around a nut housing according to the embodiment.
Figure 4A:
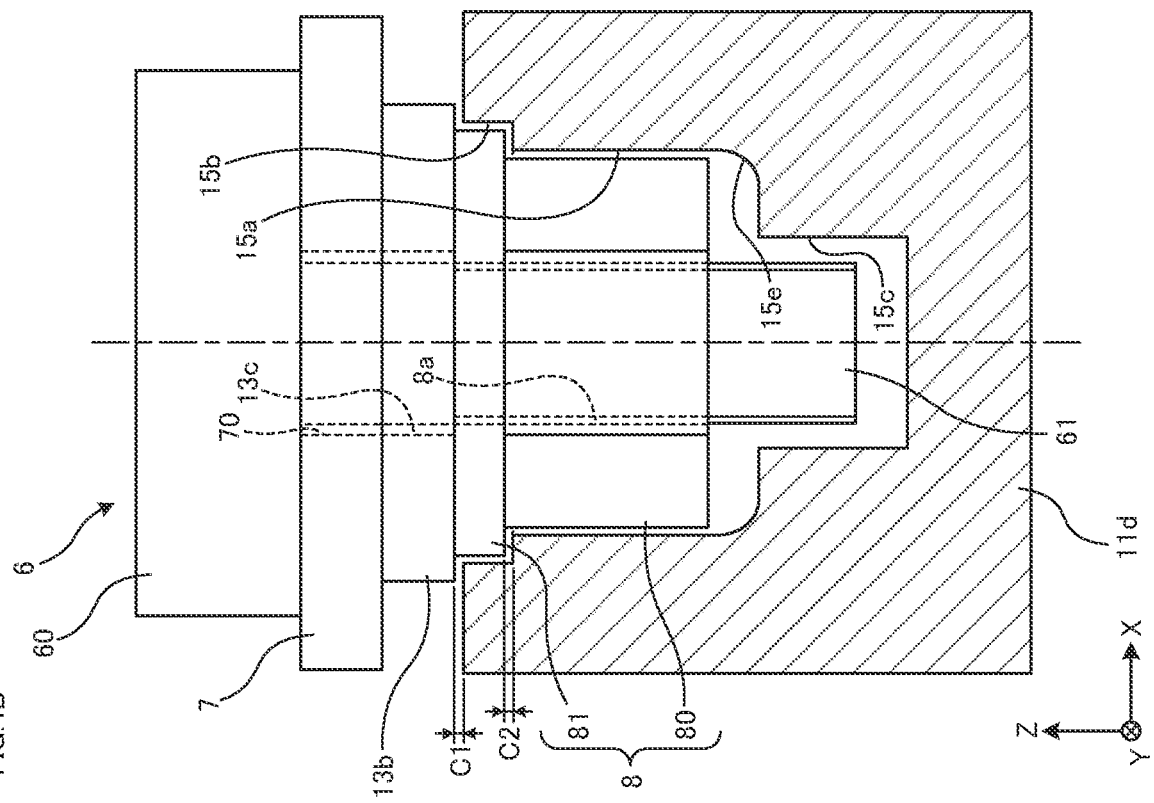
FIGS. 4A and 4B are partial cross sections of the area around the nut housing illustrated in FIG. 3.
Figure 4B:
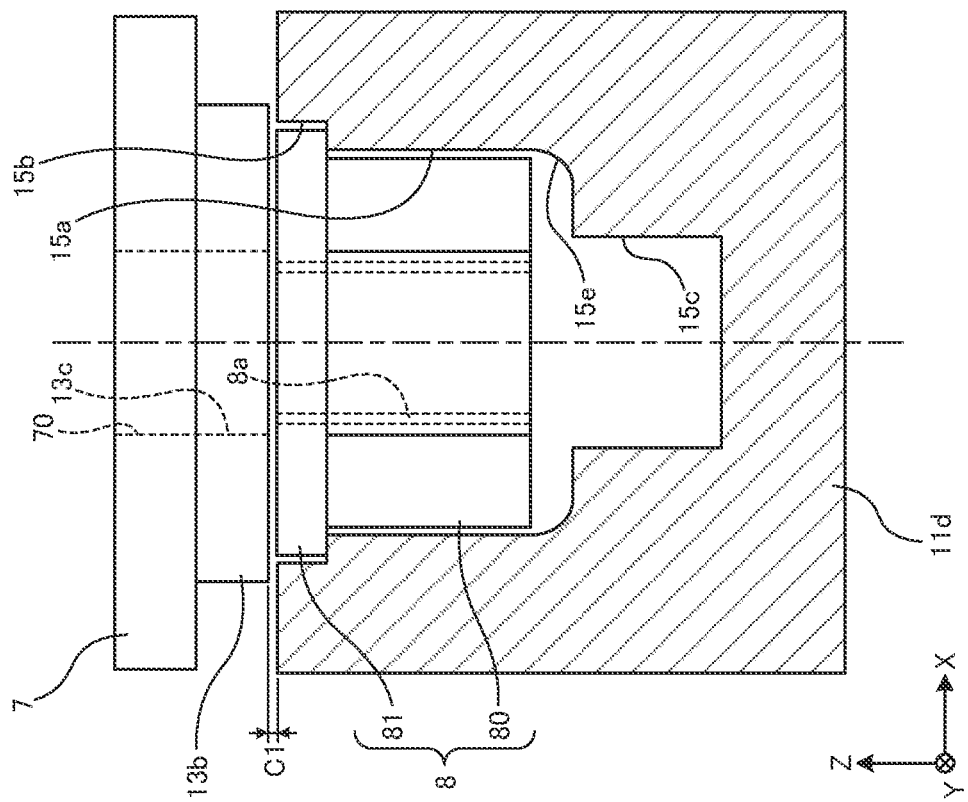

Next, FIGS. 3, 4A, 4B, 5A, and 5B will be referenced to describe a structure for securing an external conductor according to the embodiment in detail. FIG. 3 is a plan view of the area around a nut housing according to the embodiment. FIGS. 4A and 4B are partial cross sections of the area around the nut housing illustrated in FIG. 3, and is a cross section taken in the ZX plane in FIG. 3. FIGS. 5A and 5B are partial cross sections of the area around the nut housing illustrated in FIG. 3, and is a cross section taken in the YZ plane in FIG. 3. Also, FIGS. 4A and 5A illustrate the state before an external conductor is secured with a bolt, while FIGS. 4B and 5B illustrate the state after the external conductor is secured with the bolt. In FIGS. 3, 4A, 4B, 5A, and 5B, the structure surrounding the negative electrode terminal 13 is described as an example for convenience, but the structure is not limited to the negative electrode terminal 13. The areas around the positive electrode terminal 12 and the output terminal 14 are also assumed to have a similar structure.

As illustrated in FIGS. 3, 4A, 4B, 5A, and 5B, a slit 11f that is long in the X direction is formed at the boundary between the terminal placement part 11d and the case lid 11b, and penetrating the space on the inner side and also the outer side of the case member 11. The terminal placement part 11d and the case lid 11b cooperatively form the slit 11f. The slit 11f is formed between the notch formed on the side face on the terminal placement part 11d side of the case lid 11b and the flat side face of the terminal placement part 11d. The intermediate part standing up in the Z direction between the first end 13a and the second end 13b of the negative electrode terminal 13 is inserted into the slit 11f. As described above, the second end 13b projects out from the top face of the case member 11, with the leading end bent at a substantial right angle along the top face of the case member 11 (terminal placement part 11d) and toward the negative Y side. At this time, a slight gap C1 is provided between the top face of the terminal placement part 11d and the bottom face of the second end 13b.

Also, the nut housing 15 for housing the nut 8 is formed on the top face of the terminal placement part 11d. Note that the nut housing 15 is not filled with the encapsulating resin 9. The nut housing 15 forms an independent space. The nut 8 is what is called a flanged nut, and has a cylindrical main body 80 with a threaded hole 8a formed in the center, and a flange 81 projecting radially outward on one face (the top face) of the main body. The main body 80 is formed by penetrating a threaded hole 8a through the axial center of a hexagonal cylinder, for example. The flange 81 has a round shape of wider diameter than the main body 80.

The nut housing 15 is provided in correspondence with the slit 11f. Specifically, the nut housing 15 is formed near the slit 11f, in a predetermined position farther on the negative Y side than the slit 11f. The nut housing 15 has a first recess 15a that houses the main body 80, a second recess 15b that houses the flange 81, and a third recess 15c that houses the tip of a threaded part 61 of the bolt 6.

The first recess 15a is formed at a position distanced in the negative Y direction from the slit 11f. In other words, the first recess 15a is formed facing opposite the intermediate part that stands up in the Z direction of the negative electrode terminal 13. The first recess 15a has a regular hexagonal shape in a plan view corresponding to the shape of the main body 80. The hexagonal first recess 15a is formed such that one of the pairs of opposing faces defining the hexagonal shape face each other in the Y direction. In other words, the direction in which one of the pairs of opposing faces that define the hexagonal shape of the first recess 15a face each other is the same as the direction facing opposite the negative electrode terminal 13 standing up in the Z direction. One side face of the first recess 15a and the main surface of the intermediate part of the negative electrode terminal 13 face each other in parallel. Also, the first recess 15a is formed deeper than the thickness of the main body 80.

The second recess 15b is formed above the first recess 15a. Also, the second recess 15b has a round shape that is concentric with the first recess 15a, of wider diameter than the first recess 15a, and slightly wider than the outer diameter of the flange 81 of the nut 8. Additionally, the second recess 15b may have an incomplete circular shape that is incomplete because a portion of the second recess 15b protrudes from the side face of the terminal placement part 11d in a plan view. The second recess 15b is formed having a depth equal to the thickness of the flange 81.

The third recess 15c has a hole formed to a predetermined depth from the center of the floor surface of the first recess 15a. The third recess 15c has a round shape that is concentric with the first recess 15a, narrower than the inner diameter of the first recess 15a, and slightly wider than the outer diameter of the threaded part 61 of the bolt 6. The third recess 15c is formed deeper than the bottom end of the threaded part 61 threaded into the nut 8. Also, the center of the nut housing 15 (third recess 15c) is aligned with the center of the through-hole 13c of the second end 13b. In other words, the second end 13b and the nut housing 15 face opposite each other in the Z direction.

Also, in the embodiment, a portion of the nearby wall (surrounding wall) that defines the nut housing 15 (particularly the first recess 15a and the second recess 15b) is cut away. This portion is designated the notch 15d. The notch 15d is formed so as to penetrate a portion of the surrounding wall and expose the side face of the nut 8 (main body 80) that faces opposite the negative electrode terminal 13 standing up in the Z direction.

Meanwhile, in the case of inserting the bolt 6 into a through-hole 70 formed in the external conductor 7 and threading the bolt 6 into the nut 8, stress concentration may occur at the floor of the notch 15d when the bolt is tightened. As a result, there are concerns that cracks may develop in the floor of the notch 15d and the case member 11 may be damaged.

Accordingly, the inventors focused on the stress concentration location, the shape of the nut, and the depth of the nut housing, and thereby conceived of the present invention. Specifically, in the embodiment, the nut 8 has the cylindrical main body 80 in which the threaded hole 8a is formed, and the flange 81 projecting radially outward on one face of the main body 80. The nut housing 15 that houses the nut 8 has the first recess 15a that houses the main body 80 and the second recess 15b that houses the flange 81. Also formed is the notch 15d in which a portion of the surrounding wall that forms the first recess 15a and the second recess 15b is cut away. The first recess 15a is formed deeper than the thickness of the main body 80. Also, a fillet 15e is formed on the floor surface of the first recess 15a.

By increasing the depth of the first recess 15a and providing the fillet 15e at the floor thereof, the concentration of stress at the edges can be suppressed, making it possible to prevent damage to the case member 11.

Here, FIGS. 4A, 4B, 5A, and 5B will be referenced to describe operations near the nut associated with an operation of securing an external conductor. As illustrated in FIGS. 4A and 5A, in the state in which the nut 8 is housed in the nut housing 15, the bottom face of the flange 81 contacts the top face of the second recess 15b. In other words, the nut 8 is supported by the flange 81 while floating above the floor surface of the first recess 15a. At this time, the start position of the upper side of the fillet 15e preferably starts from the bottom end of the main body 80 or an even lower position.

Above the nut 8, the second end 13b of the negative electrode terminal 13 faces opposite. The slight gap C1 is formed between the bottom face of the second end 13b and the top face of the terminal placement part 11d. In other words, the slight gap C1 is formed between the top face of the flange 81 and the bottom face of the second end 13b.

When securing the external conductor 7, first, the external conductor 7 is placed on the top face of the second end 13b, and the through-hole 70 of the external conductor 7 is aligned with the through-hole 13c of the second end 13b. Thereafter, the tip of the threaded part 61 of the bolt 6 is inserted into the through-holes 70 and 13c, and the tip is threaded into the nut 8. At this time, stress concentration near the floor of the first recess 15a is suppressed by the fillet 15e. Also, because the bottom end of the nut 8 floats above the floor surface of the first recess 15a, the edges of the nut 8 do not interfere with the fillet 15e.

When the bolt 6 is fully tightened, the nut 8 is moved upward by an amount equal to the gap C1. More specifically, a head 60 of the bolt 6 contacts the top face of the external conductor 7, and the top face of the flange 81 contacts the bottom face of the second end 13b. With this arrangement, the external conductor 7 and the second end 13b are securely held between the head 60 of the bolt 6 and the nut 8 (flange 81). At this time, a slight gap C2 is formed between the bottom face of the flange 81 and the floor surface of the second recess 15b. In other words, the relationship C1=C2 holds.

Also, as illustrated by the shaded portion of FIG. 3, the fillet 15e is preferably formed so as to surround not only the floor of the notch 15d but also the bottom periphery of the first recess 15a. The fillet 15e may be formed continuously or discontinuously inside the range of the shaded portion.

Also, the notch 15d is formed at the location where the nut 8 and the negative electrode terminal 13 standing up in the Z direction face opposite. The width (length in the X direction) of the notch 15d is shorter than the width (length in the X direction) of the negative electrode terminal 13. Also, the width of the notch 15d is the same as the length of one side in a plan view that defines one of the side faces of the hexagonal shape of the first recess 15a. In other words, the notch 15d penetrates the surrounding wall by the same width as one of the side faces of the hexagonal shape perpendicular to (in the Y direction) the side face of the surrounding wall from the two corners that define the side face of the hexagonal shape of the first recess 15a.

Also, the notch 15d is formed in a location corresponding to at least the first recess 15a. Furthermore, the notch 15d may also be formed in a location corresponding to the second recess 15b. The depth (length in the Z direction) of the notch 15d may be the same as the combined depth of the first recess 15a and the second recess 15b. In other words, the floor surface of the first recess 15a and the floor surface of the notch 15d may be the same surface. With this configuration, a thin part of the surrounding wall of the case member 11 that forms the nut housing 15 can be eliminated to reduce damage. Note that the notch 15d is not formed in the third recess 15c.

Also, as in FIGS. 3, 5A, and 5B, the notch 15d is preferably formed in a location that defines one of the side faces of the hexagonal shape facing parallel to the main surface of the intermediate part of the negative electrode terminal 13 in the first recess 15a in a plan view. In other words, the side face of the hexagonal shape is preferably formed from two corners. Also, the notch 15d penetrates the surrounding wall perpendicular to (in the Y direction) the side face of the surrounding wall of the terminal placement part 11d in a plan view. In other words, the notch 15d penetrates the surrounding wall by the same width as one of the side faces of the hexagonal shape perpendicular to (in the Y direction) the side face of the surrounding wall from the two corners that define the side face of the hexagonal shape in a plan view. With this configuration, the concentration of stress on the case member 11 when tightening an external terminal can be decreased, and damage to the case member 11 can be reduced.

As described above, according to the present invention, by adopting a flanged nut, the edges on the lower end of the nut 8 do not interfere with the fillet 15e on the floor of the first recess 15a when threading into the bolt. Consequently, it is possible to achieve a structure that secures an external conductor while reducing stress concentration and preventing damage to the case.

Also, in the above embodiment, the number and placement of the semiconductor elements is not limited to the above configuration and may be changed appropriately.

Also, in the above embodiment, the number and layout of circuit boards is not limited to the above configuration and may be changed appropriately.

Also, the above embodiment takes a configuration in which the multilayer substrates and the semiconductor elements are formed in a rectangular or square shape in a plan view, but the embodiment is not limited to this configuration. The multilayer substrates and the semiconductor elements may also be formed in a polygonal shape other than the above.

Also, the above embodiment describes a case where the external terminals are each formed by a single continuous metal plate, but the external terminals are not limited to this configuration. Each external terminal may also be formed by joining a plurality of separate metal plates.

In addition, the embodiment and modifications have been described, but the above embodiment and modifications may also be combined in full or in part and treated as another embodiment.

Also, the embodiments are not limited to the above embodiment and modifications, and various other modifications, substitutions, and alterations are possible without departing from the scope of the technical idea. Further, if the technical idea can be achieved according to another method through the advancement of the technology or another derivative technology, the technical idea may be implemented using the method. Consequently, the claims cover all embodiments which may be included in the scope of the technical idea.

Features of the above embodiment are summarized below.

A semiconductor module according to the above embodiment is provided with a semiconductor element, a case that houses the semiconductor element, an external terminal that electrically connects the semiconductor element and an external conductor, and a nut into which the tip of a bolt that secures the external conductor and the external terminal is threaded. The nut includes a cylindrical main body having a threaded hole formed in the center, and a flange projecting radially outward on one face of the main body. The case includes a first recess that houses the main body, a second recess that is formed above the first recess and houses the flange, and a notch in which a portion of a surrounding wall that forms the first recess is cut away. The first recess is formed deeper than the thickness of the main body, and a fillet is formed on a floor surface of the first recess.

Also, in the semiconductor module according to the above embodiment, the external terminal is formed by a metal plate having one end housed inside the case, another end disposed in a location facing opposite the first recess and the second recess on a top face of the case, and a through-hole that penetrates through the thickness direction formed in correspondence with the threaded hole of the main body.

Also, in the semiconductor module according to the above embodiment, the other end of the external terminal forms a predetermined gap with respect to the top face of the case.

Also, in the semiconductor module according to the above embodiment, a top face of the flange contacts a bottom face of the other end of the external terminal, and a predetermined gap is formed between a bottom face of the flange and a floor surface of the second recess.

Also, in the semiconductor module according to the above embodiment, a start position of the fillet starts from a position at or below the tip of the bolt.

Also, in the semiconductor module according to the above embodiment, the fillet is formed in a floor of the notch.

Also, in the semiconductor module according to the above embodiment, the fillet is formed so as to surround a bottom periphery of the first recess.

Also, in the semiconductor module according to the above embodiment, the notch is formed in a location facing opposite the external terminal.

Also, in the semiconductor module according to the above embodiment, the first recess has a hexagonal shape in a plan view, a direction in which a pair of opposing faces that define the hexagonal shape is the same as a direction facing opposite the external terminal, and the notch is formed in the opposing portion.

Also, in the semiconductor module according to the above embodiment, the notch penetrates the surrounding wall by the same width as a side face that defines the hexagonal shape of the first recess.

Also, in the semiconductor module according to the above embodiment, the case further includes a third recess that houses the tip of the bolt, and the notch is not formed in the third recess.

As described above, the present invention has an effect of making it possible to prevent damage to the case, and is particularly useful in a semiconductor module.

REFERENCE SIGNS LIST

1: semiconductor module
2: multilayer substrate
3: multilayer substrate
4: IGBT element
5: diode element
6: bolt
7: external conductor
8: nut
8a: threaded hole
9: encapsulating resin
10: base plate
11: case member
11a: case frame
11b: case lid
11c: terminal placement part
11d: terminal placement part
11e: terminal placement part
11f: slit
12: positive electrode terminal
12a: first end
12b: second end
12c: through-hole
13: negative electrode terminal
13a: first end
13b: second end
13c: through-hole
14: output terminal
14a: first end
14b: second end
14c: through-hole
15: nut housing
15a: first recess
15b: second recess
15c: third recess
15d: notch
15e: fillet
20: insulating plate
21: heatsink
22: circuit board
23: circuit board
30: insulating plate
31: heatsink
32: circuit board
60: head
61: threaded part
70: through-hole
80: main body
81: flange
C1: gap
C2: gap
W: wiring member

What is claimed is:

1. A semiconductor module comprising:
a semiconductor element;
a case that houses the semiconductor element;
an external terminal that electrically connects the semiconductor element and an external conductor; and
a nut into which a bolt that secures the external conductor and the external terminal is threaded, wherein
the nut includes
a cylindrical main body having a threaded nut hole formed in a center thereof, and
a flange, projecting in a direction radially outward of a center axis of the threaded nut hole, beyond an outer periphery of the cylindrical main body, and disposed on one face of the main body,
the case includes a wall surrounding the nut and a fillet, the wall having
a first recess that houses the main body,
a second recess above the first recess and housing the flange, and
a notch cut in a portion of the wall that surrounds the main body,
the first recess extending deeper in the wall than the main body, and
the fillet being formed on a floor surface of the first recess.

2. The semiconductor module according to claim 1, wherein
the external terminal is a metal plate having one end housed inside the case, another end facing the first recess and the second recess on a top face of the case, the external terminal having a through-hole that penetrates therethrough and is formed at a location in correspondence with the threaded nut hole.

3. The semiconductor module according to claim 2, wherein
the other end of the external terminal is separated by a first predetermined gap from the top face of the case.

4. The semiconductor module according to claim 3, wherein
a top face of the flange contacts a bottom face of the other end of the external terminal, and a second predetermined gap separates a bottom face of the flange and a floor surface of the second recess.

5. The semiconductor module according to claim 1, wherein
a start position of the fillet starts from a position at or below a bottom of the main body.

6. The semiconductor module according to claim 1, wherein
the fillet is formed in a floor of the notch.

7. The semiconductor module according to claim 1, wherein
the fillet is formed so as to surround a bottom periphery of the first recess.

8. The semiconductor module according to claim 1, wherein
the notch is formed in a location facing the external terminal.

9. The semiconductor module according to claim 8, wherein
the first recess has a regular hexagon shape in a plan view, the regular hexagon shape being defined by three pairs of opposing side faces, one of the three pairs including opposing first and second side faces, the first side face facing the external terminal across the axis of the threaded nut hole, the second side face being disposed between said axis and the external terminal, and
the notch is formed at the second side face.

10. The semiconductor module according to claim 9, wherein
the notch penetrates the wall by a same width as that of the second side face.

11. The semiconductor module according to claim 1, wherein
the case further includes a third recess that houses the tip of the bolt, and
the notch is not formed in the third recess.

* * * * *